(12) United States Patent
Liang

(10) Patent No.: US 10,741,497 B2
(45) Date of Patent: Aug. 11, 2020

(54) CONTACT AND INTERCONNECT STRUCTURES

(71) Applicant: GLOBALFOUNDRIES INC., Grand Cayman (KY)

(72) Inventor: Jim Shih-Chun Liang, Poughkeepsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 10 days.

(21) Appl. No.: 15/897,416

(22) Filed: Feb. 15, 2018

(65) Prior Publication Data
US 2019/0252320 A1  Aug. 15, 2019

(51) Int. Cl.
| | | |
|---|---|---|
| *H01L 29/94* | (2006.01) | |
| *H01L 23/535* | (2006.01) | |
| *H01L 23/538* | (2006.01) | |
| *H01L 21/768* | (2006.01) | |

(52) U.S. Cl.
CPC ...... *H01L 23/535* (2013.01); *H01L 21/76802* (2013.01); *H01L 21/76879* (2013.01); *H01L 23/538* (2013.01)

(58) Field of Classification Search
CPC ............. H01L 23/53209; H01L 23/528; H01L 23/5226; H01L 23/53266; H01L 23/485; H01L 21/28518; H01L 21/76883; H01L 21/76843; H01L 21/76867; H01L 21/76864; H01L 2924/0002; H01L 21/76855; H01L 21/76807–76813; H01L 2221/1015–1036; H01L 2224/05157; H01L 2224/29157; H01L 2224/37157

See application file for complete search history.

(56) References Cited

U.S. PATENT DOCUMENTS

| | | | |
|---|---|---|---|
| 5,705,430 A | 1/1998 | Avanzino et al. | |
| 6,362,093 B1 | 3/2002 | Jang et al. | |
| 6,730,594 B2* | 5/2004 | Noguchi | H01L 21/02074 438/653 |
| 6,762,127 B2* | 7/2004 | Boiteux | H01L 21/02126 216/67 |
| 7,268,039 B2 | 9/2007 | Fishburn et al. | |
| 8,187,965 B2* | 5/2012 | Lin | H01L 23/5222 257/E21.476 |
| 8,313,892 B2* | 11/2012 | Kon | G03F 7/093 430/270.1 |
| 8,748,297 B2 | 6/2014 | Stranzl et al. | |
| 9,287,170 B2 | 3/2016 | Lee et al. | |

(Continued)

OTHER PUBLICATIONS

Marleen H van der Veen et al., "Cobalt Bottom-Up Contact and Via Prefill enabling Advanced Logic and DRAM Technologies", IEEE, Nov. 12, 2015, 4 pages.

*Primary Examiner* — Mary A Wilczewski
*Assistant Examiner* — Tsz K Chiu
(74) *Attorney, Agent, or Firm* — Anthony Canale; Andrew M. Calderon; Roberts Calderon Safran & Cole, P.C.

(57) ABSTRACT

The present disclosure relates to semiconductor structures and, more particularly, to contact and interconnect structures and methods of manufacture. The structure includes: a single damascene contact structure in electrical contact with a contact of a source region or drain region; and a single damascene interconnect structure in a wiring layer and in direct electrical contact with the single damascene contact structure.

9 Claims, 4 Drawing Sheets

(56) References Cited

U.S. PATENT DOCUMENTS

| | | | |
|---|---|---|---|
| 9,741,609 B1 | 8/2017 | Cheng et al. | |
| 10,263,066 B2* | 4/2019 | Hiroi | H01L 28/40 |
| 2005/0032365 A1 | 2/2005 | Marsh | |
| 2006/0202346 A1* | 9/2006 | Shih | H01L 23/53238 |
| | | | 257/774 |
| 2006/0226552 A1 | 10/2006 | Jones et al. | |
| 2007/0034963 A1* | 2/2007 | Sudo | H01L 29/7843 |
| | | | 257/369 |
| 2010/0047978 A1* | 2/2010 | Tamura | H01L 21/823807 |
| | | | 438/229 |
| 2014/0183738 A1 | 7/2014 | Jezewski et al. | |
| 2016/0163587 A1 | 6/2016 | Backes et al. | |
| 2016/0309596 A1 | 10/2016 | Shaviv et al. | |

* cited by examiner

CONTACT AND INTERCONNECT STRUCTURES

FIELD OF THE INVENTION

The present disclosure relates to semiconductor structures and, more particularly, to contact and interconnect structures and methods of manufacture.

BACKGROUND

CMOS technology is used to construct integrated circuits such as microprocessors, microcontrollers, static random access memory (SRAM) and other digital logic circuits. By virtue of continued scaling of device technologies, interconnect structures need to be reduced in size. For example, interconnect structures with dimensions of less than 30 nm are now required in many semiconductor processes.

As the devices are scaled to smaller dimensions, various designs and techniques are employed to improve device performance. For example, as the interconnect structures scale downwards, different metals or metal alloys are required with lower resistivities and better electromigration properties in order to improve device performance. Such metals, because of better electromigration properties, may not need barrier liners, which will allow interconnects made from them to have lower electrical resistance, as critical dimensions shrink, than conventionally used metals.

SUMMARY

In an aspect of the disclosure, a structure comprises: a single damascene contact structure in electrical contact with a contact of a source region or drain region; and a single damascene interconnect structure in a wiring layer and in direct electrical contact with the first single damascene contact structure.

In an aspect of the disclosure, a method comprises: forming a single damascene contact structure in electrical contact with a contact of a source region or drain region; and forming a single damascene interconnect structure in a wiring layer and in direct electrical contact with the first single damascene contact structure.

In an aspect of the disclosure, a method comprises: forming a first opening in a contact layer of material; filling the first opening with material that is selective to a subsequent etching process; forming back end of line (BEOL) material over the first opening filled with the material; forming a second opening in the BEOL material, aligned with and exposing the first opening filled with the material; removing the material from the first opening; and depositing conductive material in the first opening and the second opening.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
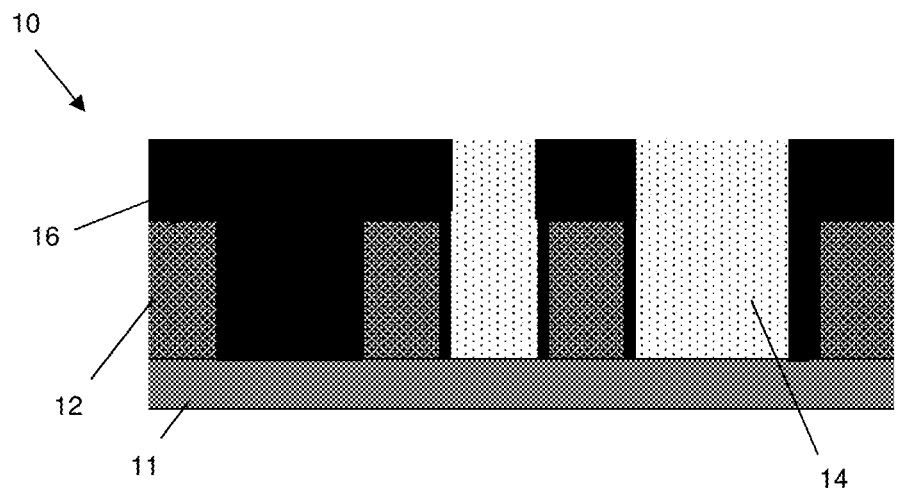
FIG. 1 shows source and drain regions and respective contacts, amongst other features, and respective fabrication processes in accordance with aspects of the present disclosure.

The present disclosure relates to semiconductor structures and, more particularly, to contact and interconnect structures and methods of manufacture. More specifically, the present disclosure relates to cobalt contact structures and interconnect structures which land on source/drain contacts (e.g., cobalt source/drain contacts) and methods of manufacture. In embodiments, the methods of forming the contact structures and interconnect structures use separate single damascene patterning processes, compared to a dual damascene process used in conventional fabrication processes. Advantageously, by implementing the separate single damascene patterning processes, the structures and methods disclosed herein are capable of significantly reducing contact resistances, amongst other advantages.

In embodiments, the contacts and interconnect structures are composed of cobalt, contacting the source/drain contacts and extending through the first wiring layer (e.g., M0 layer). Advantageously, by implementing the single damascene patterning processes described herein, the cobalt contact structures and cobalt interconnect structures, which extends into the first metal wiring layer (e.g., M0 layer), can be fabricated without any liner interface between such structures. This will effectively lower the contact resistance such that there will be negligible contact resistance between these structures, particularly compared to tungsten and copper materials used in smaller technology nodes that require appropriate liners. In addition, cobalt has lower resistivity than tungsten at small dimensions which will help lower the vertical resistance of the contact. Furthermore, cobalt has better electromigration properties than copper which can enable cobalt to be made without barrier liners; as a result, as critical dimensions shrink, BEOL interconnects made with cobalt gains the advantage of not having a lot of its volume taken up by the highly resistive barrier liner. Also, the single damascene patterning processes described herein are compatible with cobalt contacts for the source/drain region, i.e., the single damascene patterning processes will have negligible harm on the exposed source/drain cobalt surface.

By way of further advantages, the single damascene patterning processes described herein provide less corner chamfering, e.g., eliminate chamfering, of the dielectric material (compared to dual damascene processes). This, in turn, results in improved dielectric breakdown properties since a distance between the metals (e.g., gate metal and contact metal) will be greater due to intervening dielectric material, compared to a dual damascene process. This is particularly advantageous as technology shrinks to 5 nm and beyond, wherein metal contacts become closer and dielectric properties are tuned to lower dielectric constants for improved device performance. In other words, in the smaller technology nodes, the elimination of the chamfering will avoid breakdown by not losing dielectric spacing metal contacts.

Another advantage of the single damascene patterning processes is improved overlay conditions. The improved overlay conditions, for example, allow for direct overlay of the interconnect contacts to the source/drain contacts. For example, according to process assumptions, overlay 3 sigma tolerance can be +/−6 nm in the single damascene patterning processes described herein. Comparatively, for example, dual damascene processes result in more difficult direct overlay because it has to see through additional metal and contact layers or will have to rely on indirect overlay such as via to metal contact to source drain contact regions.

Yet an additional advantage of using a single damascene patterning process includes a lower aspect ratio for reactive ion etching (RIE) (e.g., ~10:1 for single damascene vs. ~20:1 for dual damascene). It should be understood by those of skill in the art that higher aspect ratios tend to cause small/unlanded contacts, as well poor metal fill. Also controlling the profile of the contacts become more difficult with high aspect dual damascene RIE processes.

In addition, the single damascene patterning processes will use less materials for the RIE processes, reducing etch stop and open issues. For example, it should be understood by those of skill in the art that the use of additional materials in dual damascene patterning processes can easily lead to etch stop and open issues, as well as providing a more challenging environment for tools and chemistry. Moreover, the single damascene patterning processes allow for wet cleaning after the contact RIE, which is difficult with dual damascene processes.

The interconnect structures of the present disclosure can be manufactured in a number of ways using a number of different tools. In general, though, the methodologies and tools are used to form structures with dimensions in the micrometer and nanometer scale. The methodologies, i.e., technologies, employed to manufacture the interconnect structures of the present disclosure have been adopted from integrated circuit (IC) technology. For example, the structures are built on wafers and are realized in films of material patterned by photolithographic processes on the top of a wafer. In particular, the fabrication of the interconnect structures uses three basic building blocks: (i) deposition of thin films of material on a substrate, (ii) applying a patterned mask on top of the films by photolithographic imaging, and (iii) etching the films selectively to the mask.

FIG. 1 shows source and drain regions and respective contacts, amongst other features, and respective fabrication processes in accordance with aspects of the present disclosure. More specifically, the structure 10 shown in FIG. 1 includes raised source and drain regions 12 grown on semiconductor material 11. In embodiments, the raised source and drain regions 12 can be formed by conventional epitaxial growth processes, e.g., epitaxial growth of semiconductor material. The semiconductor material can be, e.g., Si, SiGe or other semiconductor material, which is doped with any appropriate dopants, e.g., arsenic, phosphorous, etc., at any appropriate concentration level depending on the desired device performance. In embodiments, the source and drain regions 12 can also be planar regions (e.g., not raised).

Still referring to FIG. 1, dielectric material 14 is provided between the raised source and drain regions 12. The dielectric material 14 can be, e.g., an oxide material, that is deposited by conventional deposition methods. For example, the deposition methods can be a conventional chemical vapor deposition (CVD) process, followed by a planarization process, e.g., chemical mechanical polishing (CMP). Contacts 16 are formed in contact with raised source and drain regions 12. The contacts 16 are preferably cobalt material deposited using a conventional deposition method, e.g., CVD. In embodiments, the contacts 16 are formed by conventional lithography, etching and deposition methods, which may composed of cobalt and liner material, e.g., TiN, Ti, TaN, etc.

In embodiments, prior to the formation of the contacts 16, the source and drain regions 12 can undergo a silicide process. As should be understood by those of skill in the art, the silicide process begins with deposition of a thin transition metal layer, e.g., nickel, cobalt or titanium, over fully formed and patterned semiconductor devices (e.g., doped or ion implanted source and drain regions 12 and respective devices). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts in the active regions of the device. It should be understood by those of skill in the art that silicide contacts will not be required on the gate, when a gate structure is composed of a metal material.

Figure 2:
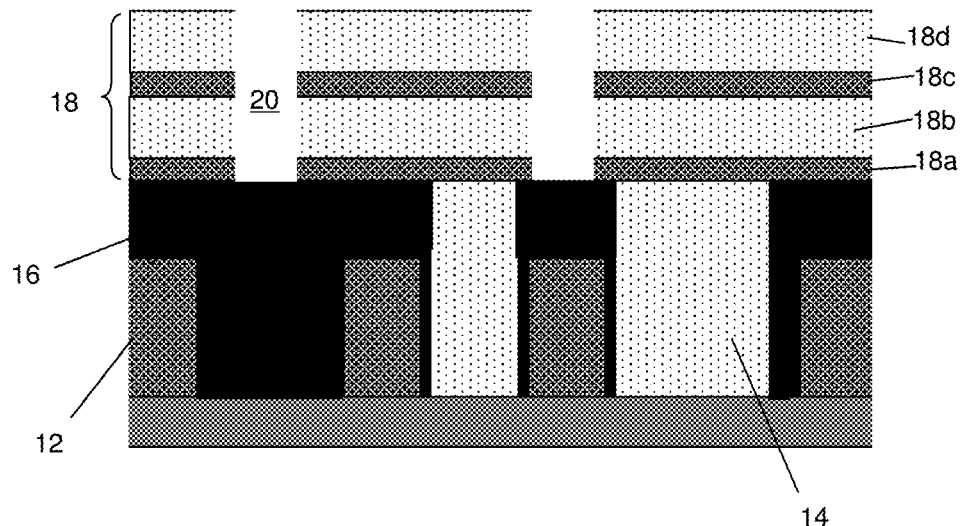
FIG. 2 shows layers of material with openings exposing contacts of the source and drain regions, amongst other features, and respective fabrication processes in accordance with aspects of the present disclosure.

FIG. 2 shows the formation of layers of material 18 on the exposed surfaces of the contacts 16 and dielectric material 14. The layers of material 18 can include a layer of SiN material 18a, oxide material 18b, SiN material 18c and oxide material 18d, as examples. In embodiments, the oxide material 18b, 18d can be TEOS, as an example. The layers of material 18 can be deposited by conventional CVD processes to a total thickness of about 100 nm; although other dimensions and materials are contemplated herein depending on the technology node and other design criteria.

A plurality of contact openings 20 are formed in the layers of material 18, aligned with and exposing a surface of the contacts 16. In embodiments, the contact openings 20 can be formed by conventional single damascene etching processes. The single damascene etching process allows the contact openings 20 to register directly to the contact 16. For example, using a single damascene patterning process, a resist formed over the oxide material 18d is exposed to energy (light) to form a pattern (opening). An etching process with a selective chemistry, e.g., reactive ion etching (RIE), will be used to form one or more contact openings 20 in the layers of material 18 through the openings of the resist. In embodiments, the contact openings 20 can have a width of approximately 20 nm to 25 nm and an aspect ratio of approximately 5:1 using the single damascene processes described herein. The resist can then be removed by a conventional oxygen ashing process or other known stripants.

Figure 3:
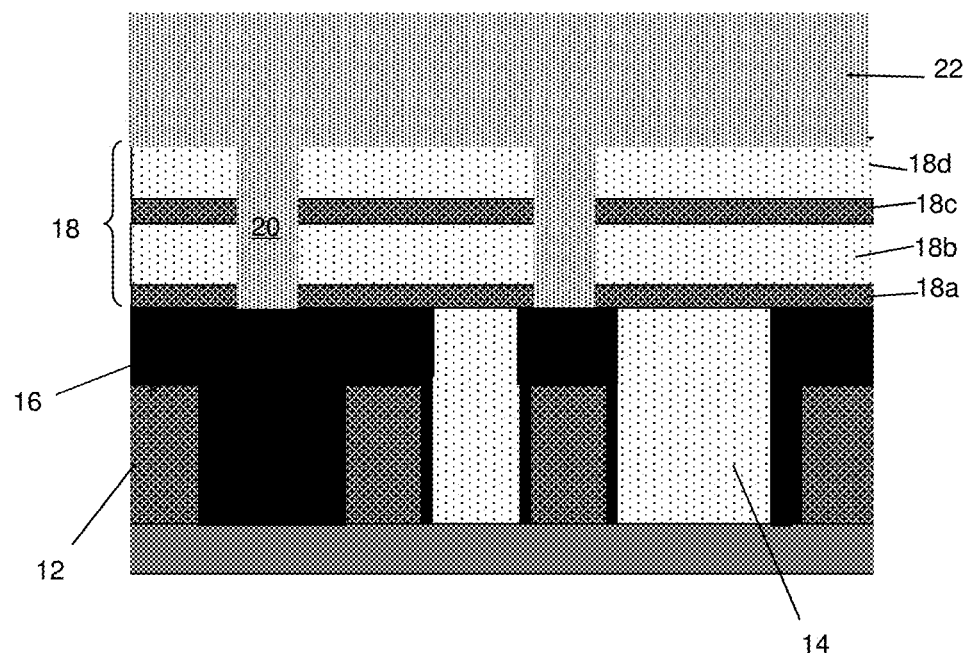
FIG. 3 shows highly selective material filling the openings, amongst other features, and respective fabrication processes in accordance with aspects of the present disclosure.

As shown in FIG. 3, following the resist removal, a highly selective material 22 is deposited within the contact openings 20. In embodiments, the highly selective material 22 is an organic dielectric layer (ODL) or other organic spin-on filler. In embodiments, the highly selective material 22 can be other sacrificial contact fill material, e.g., amorphous or poly Si or W. Advantageously, the highly selective material 22 will be highly selective to oxide RIE chemistries, while still being ashable.

Figure 4:
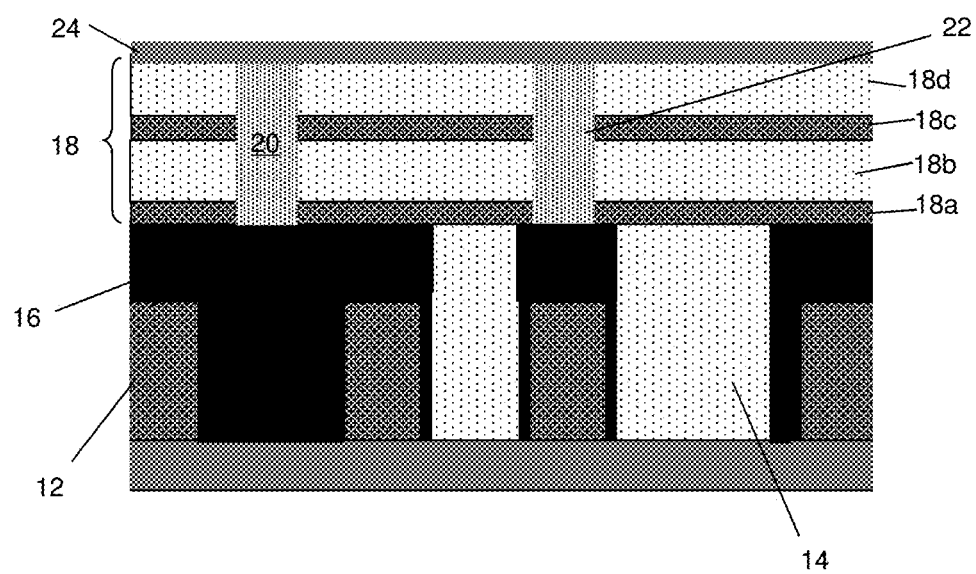
FIG. 4 shows an adhesion layer on the highly selective material, amongst other features, and respective fabrication processes in accordance with aspects of the present disclosure.

In FIG. 4, the highly selective material 22 is planarized using an end point ashing process. In alternative embodiments, the highly selective material 22 can be planarized using a conventional CMP process. In any of the embodiments, the ashing or CMP processes will stop on the layer 18d, e.g., oxide material. In this way, the contact openings 20 will remain filled with the highly selective material 22.

FIG. 4 shows an adhesion layer 24 deposited on the highly selective material 22 which fills the contact openings 20. In embodiments, the adhesion layer 24 can be a layer of Octamethylcyclotetrasiloxane adhesion layer or low temperature oxide. The adhesion layer 24 will provide an improved interface between the organic material, e.g., material 22, and dielectric material. In more specific embodiments, the adhesion layer 24 can be deposited at low temperature to seal the sacrificial fill material, e.g., highly selective material 22, without causing it to decompose and generate defects. This adhesion layer 24 will also prevent decomposition of materials which can generate defects. For example, the adhesion layer 24 will provide protection to the underlying materials during high temperature deposition processes needed for back end of line (BEOL) materials.

Figure 5:
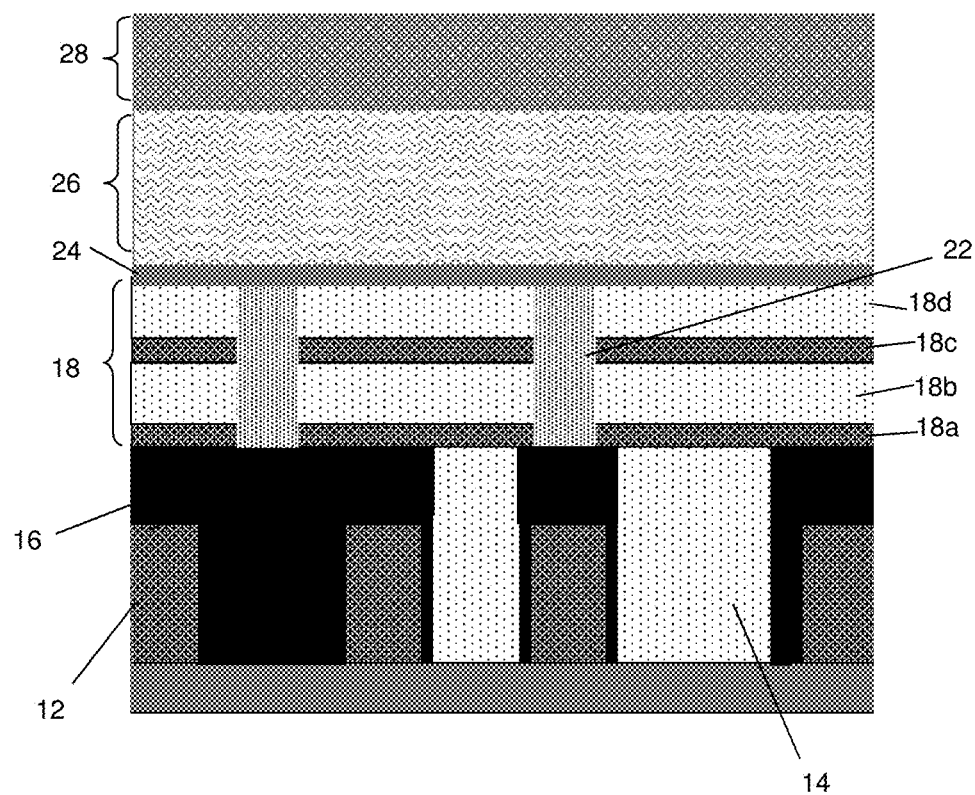
FIG. 5 shows back end of line (BEOL) materials stacked on the adhesion layer, amongst other features, and respective fabrication processes in accordance with aspects of the present disclosure.

FIG. 5 shows BEOL materials 26, 28 stacked on the adhesion layer 24, amongst other features. In embodiments, the BEOL materials 26, 28 can be deposited by consecutive conventional deposition processes, e.g., CVD. In more specific embodiments, the BEOL materials 26 can comprise a first metal layer (e.g., M0) with a stack of dielectric layers including nitrogen-doped barrier low-k (NBLok material) and oxide or Octamethylcyclotetrasiloxane material; whereas, the material 28 can be a stack of hardmask materials used in subsequent lithography and etching processes. For example, the stack of materials 28 can include a stack of Ni, TiN and SiN hardmask materials, followed by amorphous silicon and a low temperature oxide hardmask. It should be recognized, though, that other combinations of materials are contemplated herein for the BEOL materials 26, 28 and that the materials provided herein should not be considered limiting examples. The stack of materials 26 can be deposited to a thickness of about 250 nm; although other dimensions are contemplated herein.

Figure 6:
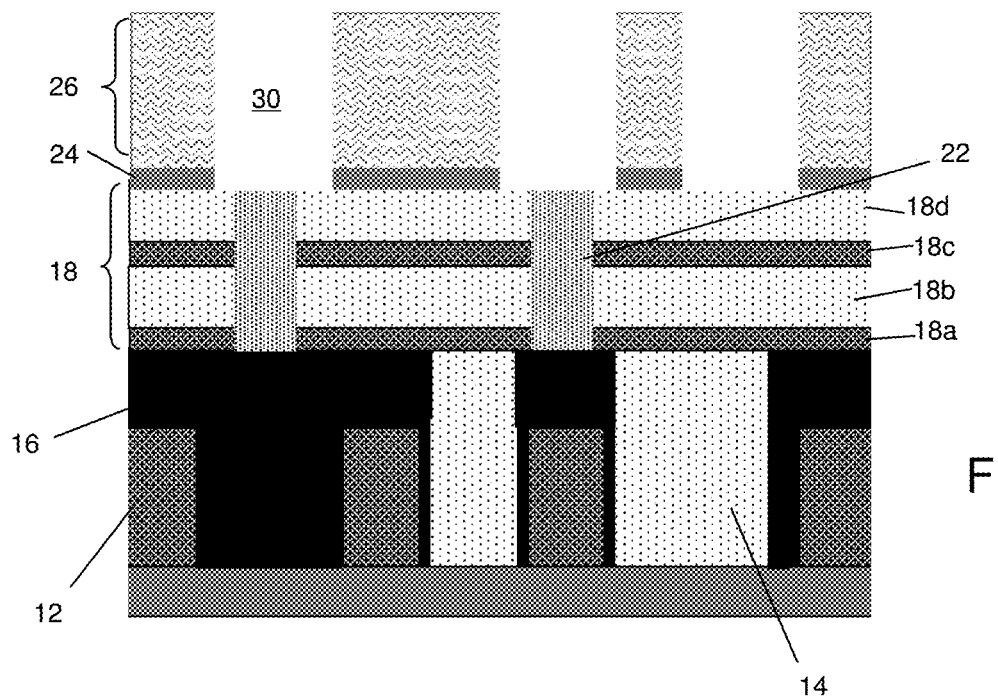
FIG. 6 shows trenches formed in the BEOL and adhesion layer, amongst other features, and respective fabrication processes in accordance with aspects of the present disclosure.

FIG. 6 shows trenches 30 formed in the BEOL material 26 and adhesion layer 24, amongst other features. In embodiments, the trenches 30 are formed by conventional single damascene RIE process, with the trenches 30 formed in self-alignment with and exposing the highly selective material 22. For example, the etching process can include a patterning step of the first metal layer (M0 layer) to the highly selective material 22. It should be understood that the highly selective material 22 is resistant to the RIE chemistry and will thus remain in the opening 20, e.g., plugging in the CA contacts. Following the RIE patterning process, the hardmask material, e.g., TiN and sacrificial nitride, can be removed with a wet chemistry such as dilute SC1 at room temp at pH ~11 and dHF. In embodiments, this process will reduce the aspect ratio of metal fill.

Figure 7:
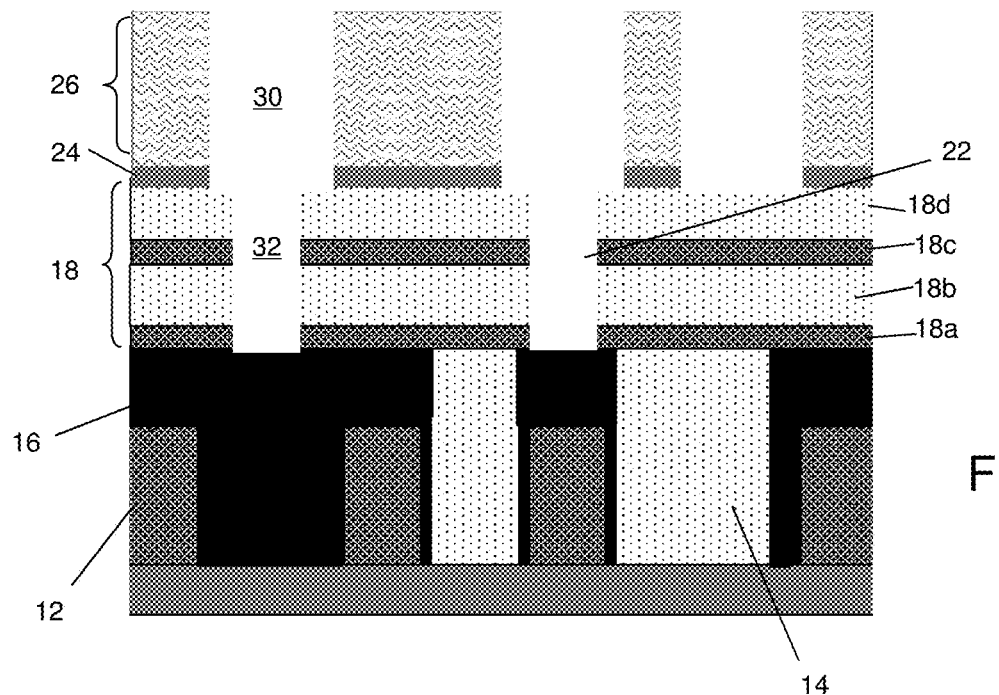
FIG. 7 shows openings (or trenches) formed by removal of the highly selective material, amongst other features, and respective fabrication processes in accordance with aspects of the present disclosure.

FIG. 7 shows openings (or trenches) 32 formed by removal of the highly selective material 22, amongst other features. In embodiments, the highly selective material 22 can be removed by using a reducing ash chemistry such as N2/H2. In the case of the material 22 being amorphous or poly silicon material, a pH controlled KOH or NH4OH chemistry can be used to remove such material. In the case of the material 22 being tungsten (W), a dilute SC1 pH controlled chemistry at room temperature can be used to remove such material.

In any of the scenarios described herein, it should be understood that this reducing ash chemistry will be selective to the Cobalt and TiN liner of the cobalt contact 16. Accordingly, the cobalt of the cobalt contact 16 will not be damaged by this process. A wet clean using, for example, dilute SC1 at room temp at pH ~11 to clean the surface after ashing may be performed with minimum impact to the exposed cobalt and TiN liner (of the cobalt contact 16). In this way, the methods thus described are compatible with the underneath cobalt, e.g., contacts 16, because of the use of a reducing ashing chemistry and wet clean that will have negligible harm on the exposed cobalt surface.

By implementing the processes thus far, two separate trenches or openings 30, 32 are formed by single damascene patterning processes to expose the underlying contacts 16. As should be understood by those of skill in the art, the two trenches or openings 30, 32 are formed by separate single damascene patterning processes, minimizing (if not eliminating) chamfering at the corners of each of the openings 30, 32. This will ensure adequate dielectric material is present between subsequently formed interconnect contacts and any gate material, thereby preventing shorts between the metal materials. Also, by the use of two separate single damascene processes, each of the separate processes has less material to see through, thus decreasing overlay issues as well as improving aspect ratios and metal fill processes.

Figure 8:
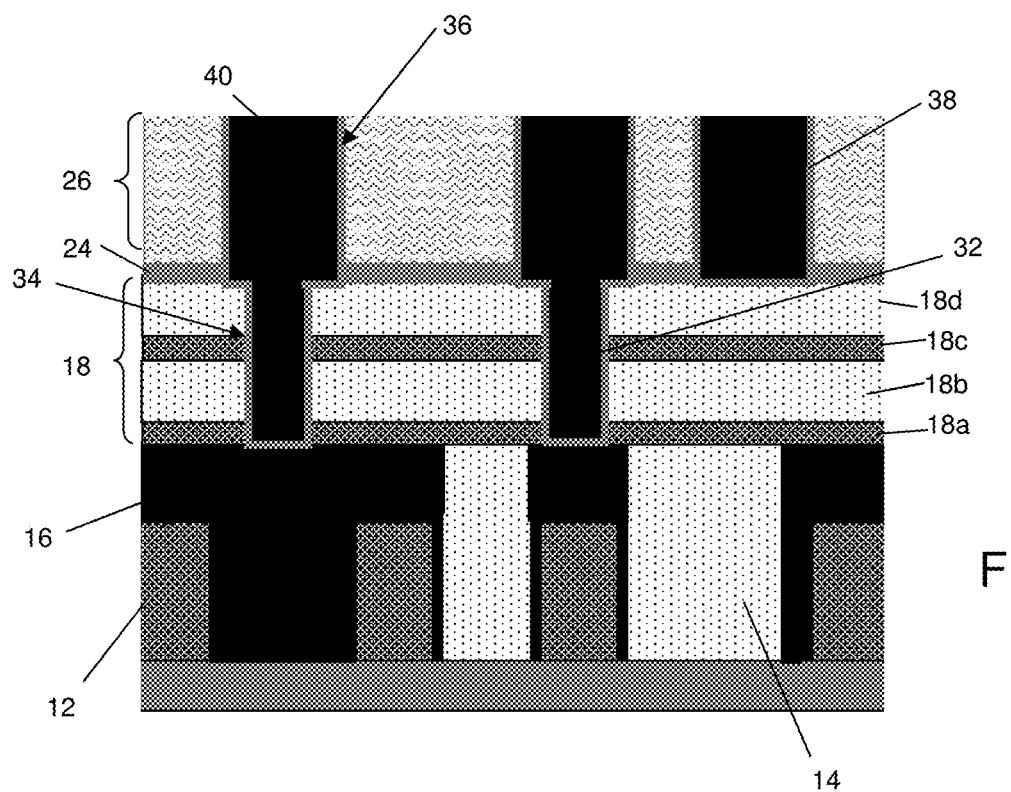
FIG. 8 shows self-aligned contact structures and interconnect structures, amongst other features, and respective fabrication processes in accordance with aspects of the present disclosure.

FIG. 8 shows contact structures 34 and interconnect structures 36 formed in the openings 30, 32. In embodiments, the contact structures 34 are formed in direct electrical contact with the contacts 16, and the interconnect structures 36 are provided in direct electrical contact with the contact structures 34 with no intervening liner material. The elimination of the liner material (compared to a dual damascene process) will significantly reduce contact resistance between the interconnect structures 36 and the contact structures 34. The interconnect structures 36 are also formed on the M0 metal wiring layer.

In embodiments, the contact structures 34 and the interconnect contact structures 36 are composed of a liner material 38 and cobalt material 40. In embodiments, the liner material 38 is used to line the sidewalls of the trenches or openings 30, 32 thus preventing time dependent dielectric breakdown (TDDB). In embodiments, the liner material 38 can be composed of, e.g., Ti/TiN, deposited to a thickness of about 2 nm to 10 nm; although other dimensions are contemplated herein depending on the technology node (including having no liner at all). In embodiments, the liner material 38 and cobalt material 40 can be deposited by separate conventional deposition processes, e.g., CVD or atomic layer deposition (ALD) processes. In alternative processes, the cobalt material 40 can be deposited by an electroplating processes from a bottom up process. For electroplating, a cobalt seed layer is deposited on top of the liner. In any of the deposition processes, the process is followed by a planarization process, e.g., CMP, to remove any residual material from a top surface of the material 26. In this way, the contact structures 34 and the interconnect contact structures 36 are self-aligned structures, without any liner at their interfaces.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A structure, comprising:
a semiconductor material;
a raised source region and raised drain region composed of epitaxial material directly on and extending upwards from the semiconductor material;
a contact in direct electrical contact with the raised source region and a contact in direct electrical contact with the raised drain region;
a single damascene contact structure in electrical contact with the contact of the raised source region or the contact of the raised drain region, and extending through an opening of multiple layers of dielectric material;
a single damascene interconnect structure in a wiring layer and in direct electrical contact with the single damascene contact structure;
insulator material between the raised source region and the raised drain region; and
an adhesion layer directly contacting a top surface of an upper layer of the multiple layers of dielectric material, wherein
the multiple layers of dielectric material includes alternating nitride material and oxide material,
the nitride material is directly contacting a surface of the contact of the raised source region and the contact of the raised drain region,
the single damascene contact structure extends through an opening in the nitride material,
the upper layer of the multiple layers of dielectric material is an oxide material, and
the single damascene interconnect structure extends through an opening in the adhesion layer and within a dielectric material directly on top of an upper surface of the adhesion layer.

2. The structure of claim 1, wherein the single damascene contact structure and the single damascene interconnect structure are cobalt contact structures.

3. The structure of claim 2, wherein the contact of the raised source region or the contact of the raised drain region is cobalt.

4. The structure of claim 3, wherein the single damascene contact structure and the single damascene interconnect structure are devoid of any liner material at an interface between cobalt contact structures.

5. The structure of claim 1, wherein the single damascene contact structure and the single damascene interconnect structure are chamferless structures.

6. The structure of claim 5, wherein the single damascene contact structure has an aspect ratio of approximately 5:1.

7. The structure of claim 1, wherein the single damascene contact structure extends in a first stack of material and the single damascene interconnect structure extends in a back end of line stack of material, with the adhesion layer between the first stack of material and the back end of line stack of material.

8. The structure of claim 1, wherein the oxide material is TEOS and the nitride material is SiN.

9. The structure of claim 1, further comprising a liner material which lines both the single damascene contact structure and the single damascene interconnect structure.

* * * * *